United States Patent
Lin et al.

(10) Patent No.: US 9,564,510 B2
(45) Date of Patent: Feb. 7, 2017

(54) METHOD OF FABRICATING A MOSFET WITH AN UNDOPED CHANNEL

(71) Applicant: Taiwan Semiconductor Manufacturing Company Limited, Hsinchu (TW)

(72) Inventors: Chih-Hsiung Lin, Hsinchu County (TW); Chia-Der Chang, Hsinchu (TW); Jung-Ting Chen, Hsinchu County (TW); Tai-Yuan Wang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 117 days.

(21) Appl. No.: 14/258,320

(22) Filed: Apr. 22, 2014

(65) Prior Publication Data
US 2015/0303278 A1   Oct. 22, 2015

(51) Int. Cl.
*H01L 29/66* (2006.01)
*H01L 29/10* (2006.01)
*H01L 21/8238* (2006.01)
*H01L 29/78* (2006.01)
*H01L 29/165* (2006.01)

(52) U.S. Cl.
CPC . *H01L 29/66545* (2013.01); *H01L 21/823807* (2013.01); *H01L 29/105* (2013.01); *H01L 29/66636* (2013.01); *H01L 29/66651* (2013.01); *H01L 29/165* (2013.01); *H01L 29/7848* (2013.01)

(58) Field of Classification Search
USPC .......... 257/E21.444, E29.255, E21.409, 387,257/E27.06, 192; 438/151, 216, 287, 199, 424
See application file for complete search history.

(56) References Cited

U.S. PATENT DOCUMENTS

2005/0253173 A1*  11/2005  Wang .............. H01L 21/823842
                                                    257/282
2005/0253176 A1    11/2005  Pyo
(Continued)

OTHER PUBLICATIONS

Korean Office Action; Application No. 10-2015-0056081; dated May 16, 2016.
(Continued)

*Primary Examiner* — Tram H Nguyen
(74) *Attorney, Agent, or Firm* — Jones Day

(57) ABSTRACT

A method of fabricating a MOSFET with an undoped channel is disclosed. The method comprises fabricating on a substrate a semiconductor structure having a dummy poly gate, dummy interlayer (IL) oxide, and a doped channel. The method further comprises removing the dummy poly gate and the dummy IL oxide to expose the doped channel, removing the doped channel from an area on the substrate, forming an undoped channel for the semiconductor structure at the area on the substrate, and forming a metal gate for the semiconductor structure. Removing the dummy poly gate may comprise dry and wet etch operations. Removing the dummy IL oxide may comprise dry etch operations. Removing the doped channel may comprise anisotropic etch operations on the substrate. Forming an undoped channel may comprise applying an epitaxial process to grow the undoped channel. The method may further comprise growing IL oxide above the undoped channel.

20 Claims, 9 Drawing Sheets

(56) References Cited

U.S. PATENT DOCUMENTS

2009/0302412 A1* 12/2009 Cheng ............. H01L 21/823807
                                                    257/506
2011/0042758 A1*  2/2011 Kikuchi ............. H01L 29/1054
                                                    257/408
2014/0027854 A1*  1/2014 Asenov ............. H01L 29/66477
                                                    257/348

OTHER PUBLICATIONS

Taiwanese Office Action; Application No. 1104112530; dated Jun. 1, 2016.
Taiwanese Office Action; Application No. 104112530; dated Aug. 9, 2016.
Korean Notice of Allowance; Application No. 10-2015-0056081; dated Nov. 11, 2016.

* cited by examiner

METHOD OF FABRICATING A MOSFET WITH AN UNDOPED CHANNEL

BACKGROUND

The technology described in this patent document relates to a metal-oxide semiconductor field-effect transistor (MOSFET), and more specifically to channel engineering for HKMG CMOS devices.

Scaling of semiconductor devices, such as a MOSFET, has enabled continued improvement in speed, performance, density, and cost per unit function of integrated circuits over the past few decades. Improvements to the process for creating a transistor channel can further the scaling of integrated circuits.

A MOSFET can be fabricated on a bulk semiconductor substrate (planar devices) or on a silicon-on-insulator (SOI) type of structure. In a replacement gate process a dummy gate structure can be formed from, for example, polysilicon (poly). After source-drain (S/D) processing is initiated or continued, the dummy gate structure is removed and replaced by an electrically conductive metal-containing gate stack that overlies a channel region between the S/D in the bulk semiconductor substrate or in the silicon layer of the SOI structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
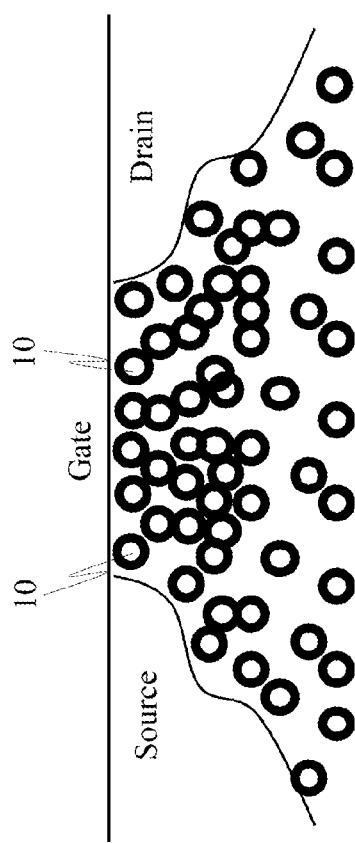
FIG. 1A is a schematic diagram of an example transistor that illustrates that functional doping techniques may leave the channel region of a transistor with non-uniform concentrations of impurities.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Well doping, light drain doping (LDD), and pocket doping are functional doping techniques that may be applied during semiconductor manufacturing. These functional doping techniques may, in some instances, for example with short channel devices, complicate carrier delivery and decrease global/localized threshold voltage (Vt) uniformity because of random dopant fluctuation (RDF). FIG. 1A is a schematic diagram of an example transistor that illustrates that functional doping techniques may leave the channel region of a transistor with non-uniform concentrations of impurities 10, which may complicate carrier delivery and decrease global/localized Vt uniformity.

Figure 1B:
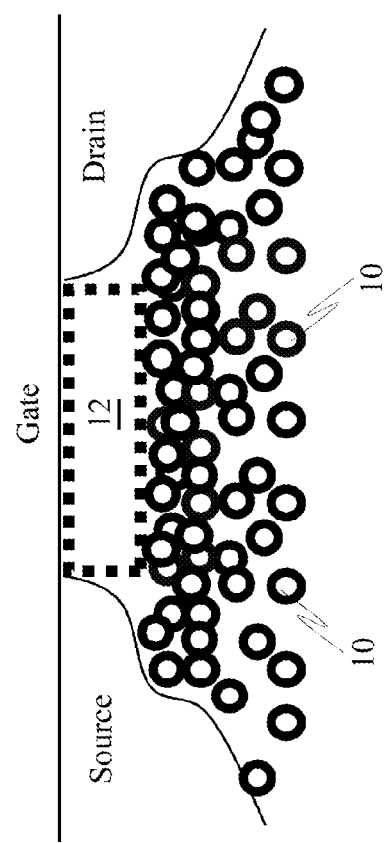
FIG. 1B is a schematic diagram of an example transistor in which impurities from functional doping techniques have been removed from at least a portion of the transistor's channel region, in accordance with some embodiments.

Depicted in FIG. 1B is a schematic diagram of a transistor in which impurities 10 from functional doping techniques have been removed from at least a portion of the transistor's channel region 12. A transistor with the impurities removed from the channel region 12 (i.e., a transistor with a clean channel) may be able to obtain greater Vt uniformity and better performance. The examples that follow illustrate exemplary techniques for fabricating a semiconductor device with a clean channel even when functional doping is applied.

Figure 2:
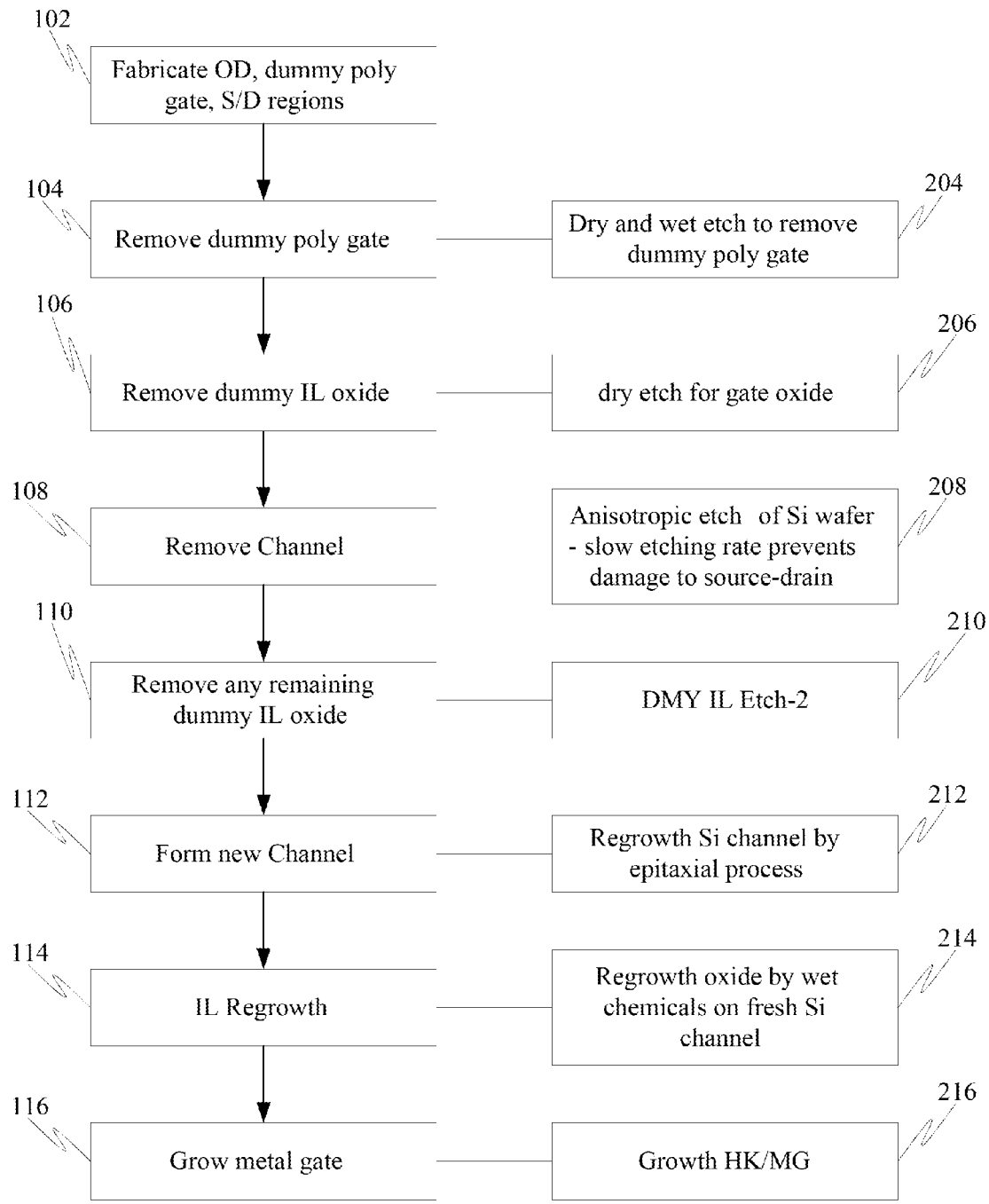
FIG. 2 is a process flow chart depicting an example method for generating a semiconductor device having an undoped channel, in accordance with some embodiments.

FIG. 2 is a process flow chart depicting an example method for generating a semiconductor device having an undoped channel. The method picks up after a semiconductor structure having a dummy poly gate, dummy interlayer (IL) oxide, and a doped channel has been fabricated on a substrate (operation 102). After this initial fabrication, the dummy poly gate is removed (operation 104) to expose the doped channel that is to be removed. Dummy poly gate removal in this example involves dry and wet etch operations (operation 204). After dummy poly gate removal, dummy IL oxide removal operations may begin (operation 106). In this example, dummy IL oxide removal involves dry etch operations (operation 206). Next, channel removal from an area on the substrate takes place (operation 108). In this example channel removal operations may involve an anisotropic etch of the Si substrate using a slow etching rate to prevent damage to the source-drain areas (operation 208). Additional dummy IL oxide may be removed (operation 110). Additional dummy oxide removal may be accomplished by a second dummy IL etching operation (operation 210). A new undoped channel is formed in the area on the wafer previously inhabited by the doped channel that had been removed (operation 112). New channel formation in this example is accomplished through an epitaxial growth process (operation 212). After new channel growth, IL oxide may be regrown above the new channel region (operation 114). The IL oxide regrowth in this example is accomplished by applying wet chemicals to the new undoped Si channel (operation 214). After IL regrowth, a metal gate may be formed (operation 116). In this example, metal gate formation involves Hi-K deposition and metal gate deposition operations (operation 216).

Figure 3:
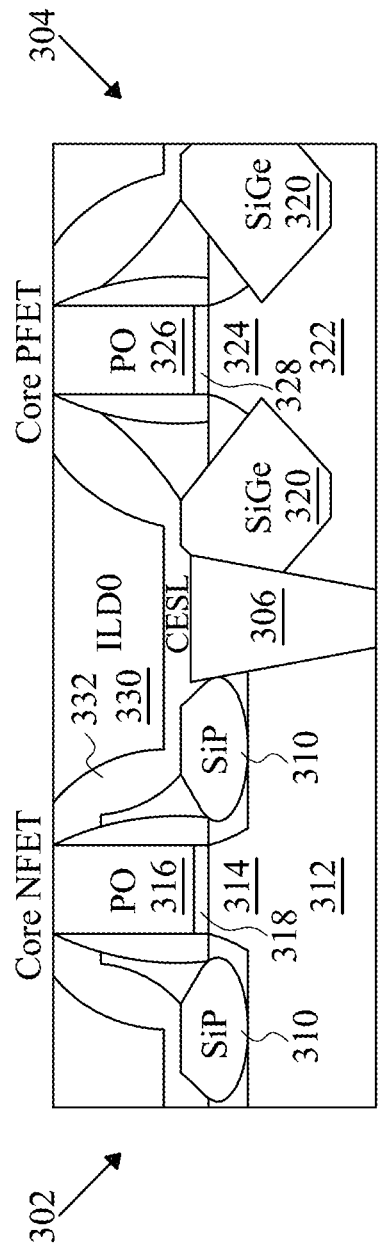
FIG. 3 depicts a cross sectional view of an example semiconductor structure after partial fabrication, in accordance with some embodiments.

FIGS. 3-9 depict cross-sectional views of an example semiconductor structure during different stages of fabrication. FIG. 3 depicts a cross sectional view of the example semiconductor structure after partial fabrication. The example semiconductor structure includes an n-channel MOSFET (NFET) 302 and a p-channel MOSFET (PFET) 304 separated by shallow trench isolation (STI) 306. Each of the NFET 302 and PFET 304 is formed above a doped well in a substrate. The NFET 302 includes source and drain regions 310 formed above a doped well 312 in a substrate, channel region 314 in the doped well 312, a dummy poly gate 316, and dummy IL oxide 318. The PFET 304 includes source and drain regions 320 formed above a doped well 322 in the substrate, channel region 324 in the doped well 322, a dummy poly gate 326, and dummy IL oxide 328. The example semiconductor structure further includes interlayer dielectric (ILDO) 330 and a contact etch stop layer (CESL) 332 shared by both the NFET 302 and the PFET 304. The channel regions 314, 324 and the doped wells 312, 322 in this example are formed from silicon (Si). The source and drain regions 310 of the NFET 302 are formed in this example from silicon phosphorous (SiP). The source and drain regions 320 of the PFET 304 are formed in this example from silicon germanium (SiGe).

Figure 4:
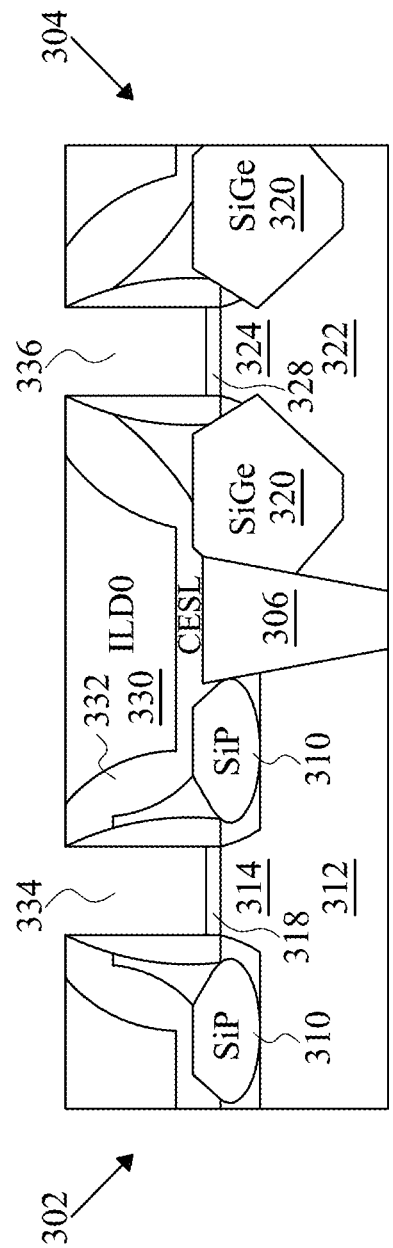
FIG. 4 depicts a cross sectional view of an example semiconductor structure after dummy poly gate removal, in accordance with some embodiments.

FIG. 4 depicts a cross sectional view of the example semiconductor structure after dummy poly gate removal. Shown are voids 334, 336 where the dummy poly gates previously existed in the NFET 302 and the PFET 304, respectively. Dummy poly gate removal, in this example, involves dry and wet etch operations.

Figure 5:
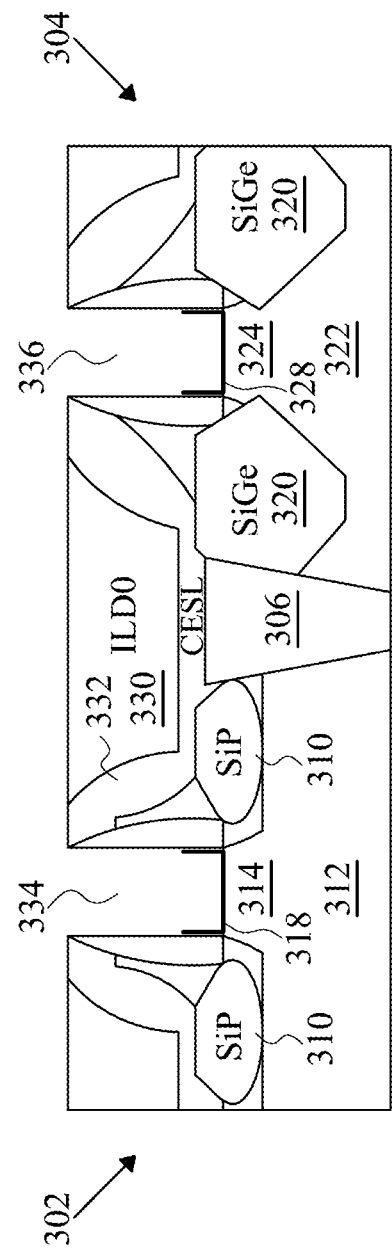
FIG. 5 depicts a cross sectional view of an example semiconductor structure after dummy IL oxide removal, in accordance with some embodiments.

FIG. 5 depicts a cross sectional view of the example semiconductor structure after dummy IL oxide removal. Shown is a reduced amount of dummy IL oxide 318, 328. The dummy IL oxide 318, 328 was removed in this example using dry etch operations.

Figure 6:
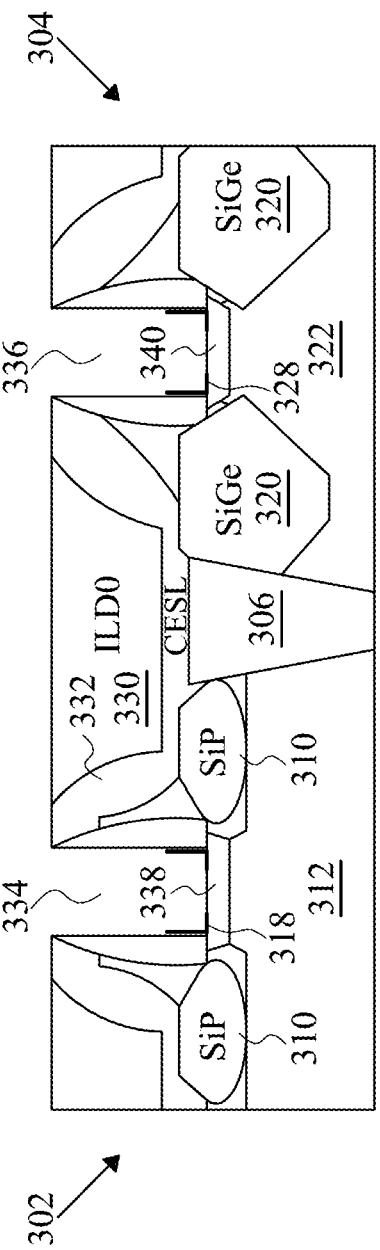
FIG. 6 depicts a cross sectional view of an example semiconductor structure after channel removal from specific areas on the substrate, in accordance with some embodiments.

FIG. 6 depicts a cross sectional view of the example semiconductor structure after channel removal from specific areas 338, 340 on the substrate. Channel removal in this example is performed by anisotropic etch of the Si substrate using a slow etching rate to prevent damage to the source-drain areas.

Figure 7:
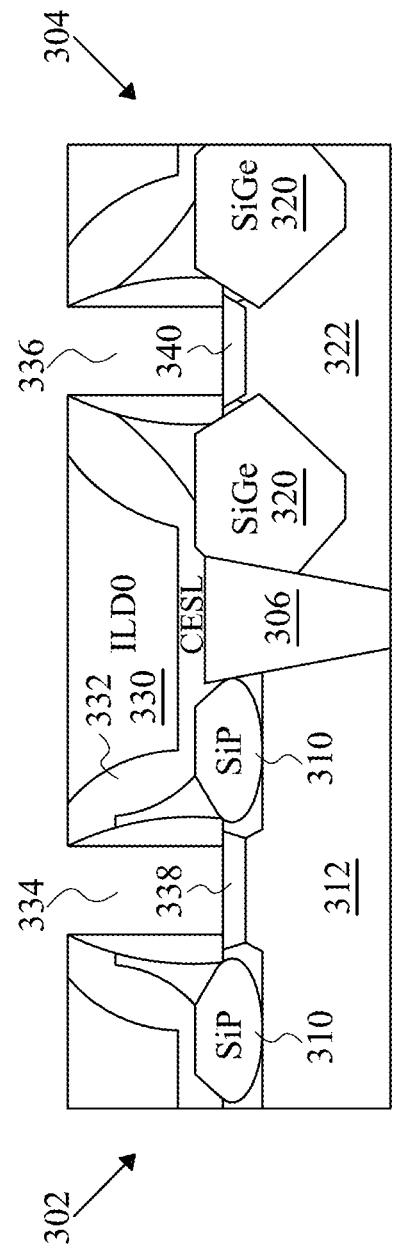
FIG. 7 depicts a cross sectional view of an example semiconductor structure after dummy IL oxide removal of additional dummy IL oxide, in accordance with some embodiments.

FIG. 7 depicts a cross sectional view of the example semiconductor structure after removal of residual dummy IL oxide. The dummy IL oxide was removed in this example using dry etch operations.

Figure 8:
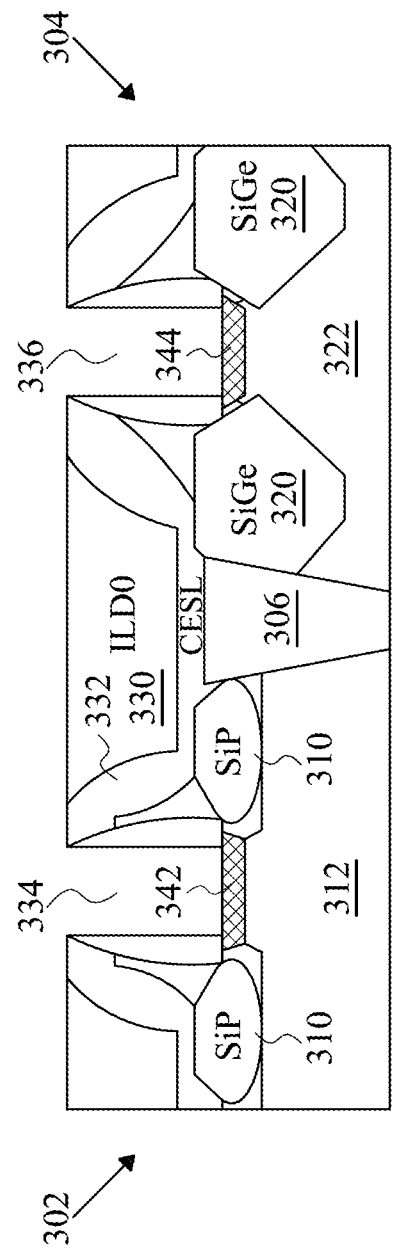
FIG. 8 depicts a cross sectional view of an example semiconductor structure after the formation of new undoped channels, in accordance with some embodiments.

FIG. 8 depicts a cross sectional view of the example semiconductor structure after the formation of new undoped channels 342, 344, respectively, in the specific areas 338, 340. The new channels 342, 344 are formed in this example by epitaxial growth processes. This results in two undoped channel regions 342, 344, respectively in doped well regions 312, 322 in the substrate. The undoped channel regions 342, 344 are, respectively, coupled between the source and drain regions 310, 320 of its corresponding transistor.

Figure 9:
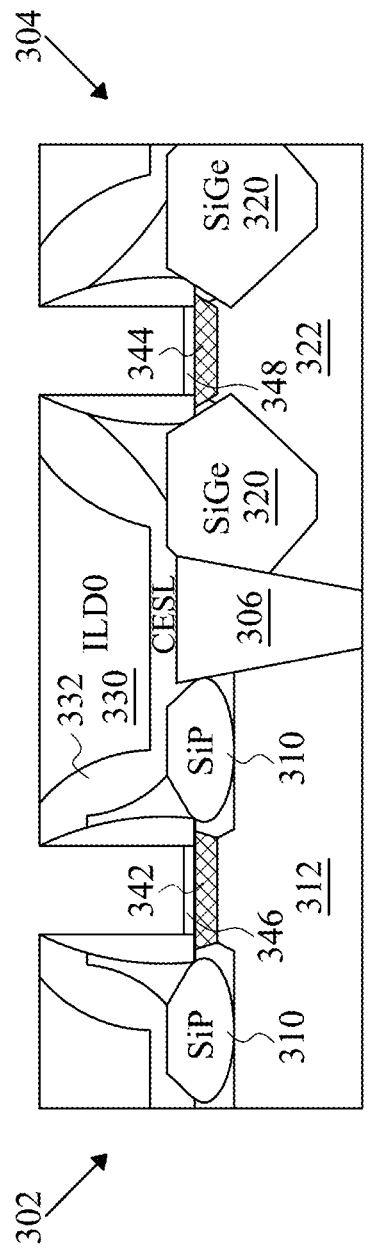
FIG. 9 depicts a cross sectional view of an example semiconductor structure after regrowth of IL oxide, in accordance with some embodiments.

FIG. 9 depicts a cross sectional view of the example semiconductor structure after regrowth of IL oxide 346, 348 above the new channel regions 342, 344. The IL oxide 346, 348 are grown, in this example, by applying wet chemicals to the new undoped Si channel regions 342, 344. After IL oxide 346, 348 regrowth, the fabrication of the semiconductor structure may continue, including formation of gate stack above the undoped Si channel regions 342, 344 and other semiconductor fabrication operations.

The foregoing examples provide techniques wherein a rarely-doped channel as well as higher Vt uniformity can be obtained through silicon (or other channel material) regrowth. The foregoing examples illustrate techniques that may be implemented for meeting high Vt uniformity demands for sub-28 nm IC devices. The new buried channel fabrication technique disclosed herein may be fully integrated with replace metal gate technology.

In one embodiment, disclosed is a method of fabricating a MOSFET with an undoped channel. The method comprises fabricating on a substrate a semiconductor structure having a dummy poly gate, dummy interlayer (IL) oxide, and a doped channel. The method further comprises removing the dummy poly gate and the dummy IL oxide to expose the doped channel, removing the doped channel from an area on the substrate, forming an undoped channel for the semiconductor structure at the area on the substrate, and forming a metal gate for the semiconductor structure.

These aspects and other embodiments may include one or more of the following features. Removing the dummy poly gate may comprise dry and wet etch operations to remove the dummy poly gate. Removing the dummy IL oxide may comprise dry etch operations to remove the dummy IL oxide. Removing the doped channel may comprise anisotropic etch operations on the substrate. Forming an undoped channel may comprise applying an epitaxial process to grow the undoped channel. The method may further comprise growing IL oxide above the undoped channel by applying wet chemicals to the undoped channel. Removing the dummy IL oxide may comprise performing etching operations both before and after removing the doped channel.

In another embodiment, a method of replacing a doped channel on a substrate in a semiconductor structure with an undoped channel is disclosed. The method comprises removing a dummy poly gate and dummy interlayer (IL) oxide to expose the doped channel, removing the doped channel from an area on the substrate, and growing an undoped channel for the semiconductor structure at the area on the substrate.

These aspects and other embodiments may include one or more of the following features. Removing the dummy poly gate may comprise dry and wet etch operations to remove the dummy poly gate. Removing the dummy IL oxide may comprise dry etch operations to remove the dummy IL oxide. Removing the doped channel may comprise anisotropic etch operations on the substrate. Growing an undoped channel may comprise applying an epitaxial process to grow the undoped channel. The method may further comprise growing IL oxide above the undoped channel by applying wet chemicals to the undoped channel. Removing the dummy IL oxide may comprise performing etching operations both before and after removing the doped channel.

In another embodiment, a semiconductor device formed above a doped well in a substrate and having an undoped channel region is disclosed. The semiconductor device comprises a source and drain region in a substrate and an undoped channel region in a doped well in the substrate. The undoped channel region is coupled between the source and drain regions. The semiconductor device further comprises a gate stack fabricated above the undoped channel region. The undoped channel region was formed by removing a dummy poly gate and dummy interlayer (IL) oxide to expose a doped channel region in the doped well, removing the doped channel region from the substrate, and growing an undoped channel region in the doped well to replace the doped channel region.

These aspects and other embodiments may include one or more of the following features. The dummy poly gate was removed using dry and wet etch operations. The dummy IL oxide was removed using dry etch operations. The doped channel was removed using anisotropic etch operations. The undoped channel was grown using an epitaxial process. The dummy IL oxide was removed by performing etching operations both before and after removing the doped channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a MOSFET with an undoped channel, the method comprising:
   fabricating on a substrate a semiconductor structure having a dummy poly gate, dummy interlayer (IL) oxide, and a doped channel;
   removing the dummy poly gate and the dummy IL oxide to expose the doped channel;
   removing the doped channel from an area on the substrate;
   forming an undoped channel for the semiconductor structure at the area on the substrate, wherein the undoped channel is directly above the doped well in the substrate; and
   forming a metal gate for the semiconductor structure.

2. The method of claim 1, wherein the removing the dummy poly gate comprises dry and wet etch operations to remove the dummy poly gate.

3. The method of claim 1, wherein the removing the dummy IL oxide comprises dry etch operations to remove the dummy IL oxide.

4. The method of claim 1, wherein the removing the doped channel comprises anisotropic etch operations on the substrate.

5. The method of claim 1, wherein forming an undoped channel comprises applying an epitaxial process to grow the undoped channel.

6. The method of claim 1, further comprising growing IL oxide above the undoped channel by applying wet chemicals to the undoped channel.

7. The method of claim 1, wherein the removing the dummy IL oxide comprises performing etching operations both before and after removing the doped channel.

8. A method of replacing a doped channel on a substrate in a semiconductor structure with an undoped channel, the method comprising:
   removing a dummy poly gate and dummy interlayer (IL) oxide to expose the doped channel;
   removing the doped channel from an area on the substrate; and
   growing an undoped channel for the semiconductor structure at the area on the substrate, wherein the undoped channel is directly above the doped well in the substrate.

9. The method of claim 8, wherein the removing the dummy poly gate comprises dry and wet etch operations to remove the dummy poly gate.

10. The method of claim 8, wherein the removing the dummy IL oxide comprises dry etch operations to remove the dummy IL oxide.

11. The method of claim 8, wherein the removing the doped channel comprises anisotropic etch operations on the substrate.

12. The method of claim 8, wherein growing an undoped channel comprises applying an epitaxial process to grow the undoped channel.

13. The method of claim 8, further comprising growing IL oxide above the undoped channel by applying wet chemicals to the undoped channel.

14. The method of claim 8, wherein the removing the dummy IL oxide comprises performing etching operations both before and after removing the doped channel.

15. A semiconductor structure formed above a doped well in a substrate and having an undoped channel region, the semiconductor structure comprising:
   a source and drain region in a substrate;
   an undoped channel region in a directly above the doped well in the substrate, the undoped channel region coupled between the source and drain regions; and
   a gate stack fabricated above the undoped channel region;
   wherein the undoped channel region was formed by removing a dummy poly gate and dummy interlayer (IL) oxide to expose a doped channel region in the doped well, removing the doped channel region from the substrate, and growing an undoped channel region in the doped well to replace the doped channel region.

16. The semiconductor structure of claim 15, wherein the dummy poly gate was removed using dry and wet etch operations.

17. The semiconductor structure of claim 15, wherein the dummy IL oxide was removed using dry etch operations.

18. The semiconductor structure of claim 15, wherein the doped channel was removed using anisotropic etch operations.

19. The semiconductor structure of claim 15, wherein the undoped channel was grown using an epitaxial process.

20. The semiconductor structure of claim 15, wherein the dummy IL oxide was removed by performing etching operations both before and after removing the doped channel.

* * * * *